United States Patent
Duppalli et al.

(10) Patent No.: US 11,764,748 B2
(45) Date of Patent: Sep. 19, 2023

(54) MODULAR ELECTROMAGNETIC INTERFERENCE FILTER INDUCTOR CORE

(71) Applicant: Cummins Inc., Columbus, IN (US)

(72) Inventors: Veda Samhitha Duppalli, Fridley, MN (US); Santhosh Krishnamoorthi, Indianapolis, IN (US); Sanchit Mishra, Minneapolis, MN (US); Jaroslaw Leonarski, Columbus, IN (US); Subbarao Dakshina Murthy-Bellur, Plymouth, MN (US)

(73) Assignee: CUMMINS INC., Columbus, IN (US)

( * ) Notice: Subject to any disclaimer, the term of this patent is extended or adjusted under 35 U.S.C. 154(b) by 63 days.

(21) Appl. No.: 17/473,371

(22) Filed: Sep. 13, 2021

(65) Prior Publication Data

US 2022/0103148 A1 Mar. 31, 2022

Related U.S. Application Data

(60) Provisional application No. 63/083,504, filed on Sep. 25, 2020.

(51) Int. Cl.
*H03H 7/01* (2006.01)
*H01F 27/24* (2006.01)
*H03H 1/00* (2006.01)

(52) U.S. Cl.
CPC ........... *H03H 7/0115* (2013.01); *H01F 27/24* (2013.01); *H03H 1/0007* (2013.01)

(58) Field of Classification Search
CPC ..... H03H 1/0007; H03H 7/0115; H01F 27/24
USPC ......................................... 333/175, 181, 185
See application file for complete search history.

(56) References Cited

U.S. PATENT DOCUMENTS

| | | | |
|---|---|---|---|
| 9,490,766 B2 * | 11/2016 | Kisner | ................. H03H 7/0115 |
| 10,263,586 B2 | 4/2019 | Ridder | |
| 2007/0052500 A1 * | 3/2007 | Korich | ................. H01R 13/719 |
| | | | 333/202 |
| 2012/0280779 A1 | 11/2012 | Shih | |
| 2015/0372655 A1 * | 12/2015 | Beck | ....................... H01F 27/24 |
| | | | 333/185 |

FOREIGN PATENT DOCUMENTS

WO 2014122095 A1 8/2014

* cited by examiner

*Primary Examiner* — Rakesh B Patel
(74) *Attorney, Agent, or Firm* — Faegre Drinker Biddle & Reath LLP

(57) ABSTRACT

Disclosed are designs for inductor cores for electromagnetic interference (EMI) filters. In some embodiments, an inductor core comprises a plurality of enclosed structures, where each enclosed structure of the plurality of enclosed structures includes a plurality of elongated bars and at least one connection device. In some embodiments, an enclosed structure is configured to encompass a signal bus. In some embodiments, an enclosed structure has a longitudinal axis and a triangular cross-sectional shape taken perpendicular to the longitudinal axis.

21 Claims, 6 Drawing Sheets

MODULAR ELECTROMAGNETIC INTERFERENCE FILTER INDUCTOR CORE

CROSS-REFERENCE TO RELATED APPLICATIONS

The present application claims priority to U.S. Provisional Application No. 63/083,504, filed on Sep. 25, 2020, the entire disclosure of which being hereby expressly incorporated herein by reference.

TECHNICAL FIELD

The present disclosure generally relates to an electromagnetic interference (EMI) filter and component(s) of the EMI filter. Specifically, some embodiments are related to the inductor core of the EMI filter.

BACKGROUND

Electromagnetic interference (EMI) filters are designed to suppress electromagnetic noise present on power and signal lines. Most electromagnetic noises are high frequency, so EMI filters are often low-pass filters to block high frequency signals while letting low frequency signals pass through. EMI filters typically includes inductors and capacitors. A variable frequency drive (VFD) is a type of motor controller that drives an electric motor by varying the frequency and voltage of its power supply. The VFD can control ramp-up and ramp-down of the motor during start or stop, respectively. An EMI filter can be used with the VFD to reduce electromagnetic noises. The VFD can provide control for multiphase (e.g., three-phase, six-phase) alternating current (AC) motors.

SUMMARY

EMI filters are used widely with power lines and/or signal lines to suppress electromagnetic noise. EMI filters can be used with AC lines/buses and/or direct current (DC) lines/buses. In some cases, EMI filters can be used with multiphase AC lines/buses. In some cases, EMI filters can be used with DC lines/buses of different directions. At least some embodiments of the present disclosure are directed to modular inductor core designs of EMI filters. In some cases, the modular inductor cores are configured to encompass power buses and/or signal buses. As used herein, a signal bus, a power bus, a signal line, and a power line are all referred to as a signal bus. In some cases, the modular inductor cores include a plurality of elongated bars arranged as an enclosed structure. In such cases, the enclosed structure includes a flat base to keep the enclosed bus(es) in place. In some embodiments, the modular inductor cores have a triangular cross-sectional shape, which can be a compact structure with good mechanical characteristics to encompass one or more signal buses.

As recited in examples, Example 1 is an inductor core of an electromagnetic interference (EMI) filter. The inductor core comprises a plurality of enclosed structures, each enclosed structure of the plurality of enclosed structures comprising a plurality of elongated bars and at least one connection device. In this example, each elongated bar of the plurality of the elongated bars comprises a magnetic material, and each enclosed structure of the plurality of enclosed structures is configured to encompass a signal bus.

Example 2 is the inductor core of Example 1, wherein each enclosed structure of the plurality of enclosed structures has a longitudinal axis; and wherein at least one of the plurality of enclosed structures has a triangular cross-sectional shape taken perpendicular to the longitudinal axis.

Example 3 is the inductor core of Example 2, wherein two of the plurality of enclosed structures each has a triangular cross-sectional shape, and wherein the two of the plurality of enclosed structures are arranged to form a parallelogram.

Example 4 is the inductor core of any one of the Examples 1-3, wherein two of the plurality of enclosed structures each is configured to encompass a respective bus, and wherein the respective buses have different phases from each other.

Example 5 is the inductor core of any one of Examples 1-4, wherein the at least one connection device comprises at least one of an adhesive and a fastener.

Example 6 is the inductor core of Any one of Examples 1-5, wherein at least one of the plurality of enclosed structures are configured to encompass a direct-current (DC) bus.

Example 7 is the inductor core of Any one of Examples 1-6, wherein at least one of the plurality of enclosed structures are configured to encompass a plurality of DC buses having different directions.

Example 8 is the inductor core of Any one of Examples 1-7, wherein at least one of the plurality of enclosed structures are configured to encompass an alternating-current (AC) bus.

Example 9 is the inductor core of Example 8, wherein the plurality of enclosed structures are configured to encompass a plurality of AC buses having different phases.

Example 10 is the inductor core of any one of Examples 1-9, wherein the magnetic material comprises at least one of ferrite, iron, and steel.

Example 11 is an EMI filter. The EMI filter comprises a capacitor; and an inductor having an inductor core, the inductor core comprising a plurality of enclosed structures, each enclosed structure comprising a plurality of elongated bars and at least one connection device. In this example, each elongated bar of the plurality of the elongated bars comprises a magnetic material; and each enclosed structures of the plurality of enclosed structures is configured to encompass a bus of a power supply.

Example 12 is the EMI filter of Example 11, wherein each enclosed structure of the plurality of enclosed structures has a longitudinal axis, and wherein at least one of the plurality of enclosed structures has a triangular cross-sectional shape taken perpendicular to the longitudinal axis.

Example 13 is the EMI filter of Example 12, wherein two of the plurality of enclosed structures each has a triangular cross-sectional shape, and wherein the two of the plurality of enclosed structures are arranged to form a parallelogram.

Example 14 is the EMI filter of any one of Examples 11-13, wherein two of the plurality of enclosed structure each is configured to encompass a respective bus, and wherein the respective buses have different phases from each other.

Example 15 is the EMI filter of any one of Examples 11-14, wherein the at least one connection device comprises at least one of an adhesive and a fastener.

Example 16 is the EMI filter of any one of Examples 11-15, wherein at least one of the plurality of enclosed structures are configured to encompass a direct-current (DC) bus.

Example 17 is the EMI filter of any one of Examples 11-16, wherein at least one of the plurality of enclosed structures are configured to encompass a plurality of DC buses having different directions.

Example 18 is the EMI filter of any one of Examples 11-17, wherein at least one of the plurality of enclosed structures are configured to encompass an alternating-current (AC) bus.

Example 19 is the EMI filter of Example 18, wherein the plurality of enclosed structures are configured to encompass a plurality of AC buses having different phases.

Example 20 is the EMI filter of any one of Examples 11-19, wherein the magnetic material comprises at least one of ferrite, iron, and steel.

Example 21 is an inductor core of an electromagnetic interference (EMI) filter. The inductor core comprises a plurality of enclosed structures, each enclosed structure of the plurality of enclosed structures having a longitudinal axis and a triangular cross-sectional shape taken perpendicular to the longitudinal axis. In this example, each enclosed structure of the plurality of enclosed structures comprises a magnetic material; and each enclosed structure of the plurality of enclosed structures is configured to encompass a signal bus.

Example 22 is the inductor core of Example 21, wherein two enclosed structures of the plurality of enclosed structures are arranged to form a parallelogram.

Example 23 is the inductor core of Example 21 or 22, wherein two of the plurality of enclosed structures each is configured to encompass a respective bus, and wherein the respective buses have different phases from each other.

Example 24 is the inductor core of any one of Examples 21-23, wherein each enclosed structure of the plurality of enclosed structures comprising a plurality of elongated bars and at least one connection device.

Example 25 is the inductor core of Example 24, wherein the at least one connection device comprises at least one of an adhesive and a fastener.

Example 26 is the inductor core of any one of Examples 21-25, wherein at least one of the plurality of enclosed structures are configured to encompass a direct-current (DC) bus.

Example 27 is the inductor core of any one of Examples 21-26, wherein at least one of the plurality of enclosed structures are configured to encompass a plurality of DC buses having different directions.

Example 28 is the inductor core of any one of Examples 21-27, wherein at least one of the plurality of enclosed structures are configured to encompass an alternating-current (AC) bus.

Example 29 is the inductor core of Example 28, wherein the plurality of enclosed structures are configured to encompass a plurality of AC buses having different phases.

Example 30 is the inductor core of any one of Examples 21-29, wherein the magnetic material comprises at least one of ferrite, iron, and steel.

Example 31 is an EMI filter. The EMI filter comprises a capacitor; and an inductor having an inductor core, the inductor core comprising a plurality of enclosed structures, each enclosed structure of the plurality of enclosed structures having a longitudinal axis and a triangular cross-sectional shape taken perpendicular to the longitudinal axis. In this example, each enclosed structure of the plurality of enclosed structures comprises a magnetic material; and each enclosed structures of the plurality of enclosed structures is configured to encompass a bus of a power supply.

Example 32 is the EMI filter of Example 31, wherein two enclosed structures of the plurality of enclosed structures are arranged to form a parallelogram.

Example 33 is the EMI filter of Example 31 or 32, wherein two of the plurality of enclosed structure each is configured to encompass a respective bus, and wherein the respective buses have different phases from each other.

Example 34 is the EMI filter of any one of Examples 31-33, wherein each enclosed structure of the plurality of enclosed structures comprising a plurality of elongated bars and at least one connection device.

Example 35 is the EMI filter of any one of Examples 31-34, wherein the at least one connection device comprises at least one of an adhesive and a fastener.

Example 36 is the EMI filter of any one of Examples 31-35, wherein at least one of the plurality of enclosed structures are configured to encompass a direct-current (DC) bus.

Example 37 is the EMI filter of any one of Examples 31-36, wherein at least one of the plurality of enclosed structures are configured to encompass a plurality of DC buses having different directions.

Example 38 is the EMI filter of any one of Examples 31-37, wherein at least one of the plurality of enclosed structures are configured to encompass an alternating-current (AC) bus.

Example 39 is the EMI filter of Example 38, wherein the plurality of enclosed structures are configured to encompass a plurality of AC buses having different phases.

Example 40 is the EMI filter of any one of Examples 31-39, wherein the magnetic material comprises at least one of ferrite, iron, and steel.

BRIEF DESCRIPTION OF THE DRAWINGS

The above-mentioned and other features of this disclosure and the manner of obtaining them will become more apparent and the disclosure itself will be better understood by reference to the following description of embodiments of the present disclosure taken in conjunction with the accompanying drawings, wherein.

DETAILED DESCRIPTION

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

As used herein, when an element, component, device or layer is described as being "on" "connected to," "coupled to" or "in contact with" another element, component, device or layer, it can be directly on, directly connected to, directly coupled with, in direct contact with, or intervening elements, components, devices or layers may be on, connected, coupled or in contact with the particular element, component or layer, for example. When an element, component, device or layer for example is referred to as being "directly on," "directly connected to," "directly coupled to," or "directly in contact with" another element, component, device or layer, there are no intervening elements, components, devices or layers for example.

As used herein, the term "based on" is not meant to be restrictive, but rather indicates that a determination, identification, prediction, calculation, and/or the like, is performed by using, at least, the term following "based on" as an input. For example, predicting an outcome based on a particular piece of information may additionally, or alternatively, base the same determination on another piece of information. Additionally, a "set," "subset," "series" or "group" of items (e.g., inputs, algorithms, data values, etc.) may include one or more items, and, similarly, a subset or subgroup of items may include one or more items. A "plurality" means more than one.

Figure 1:
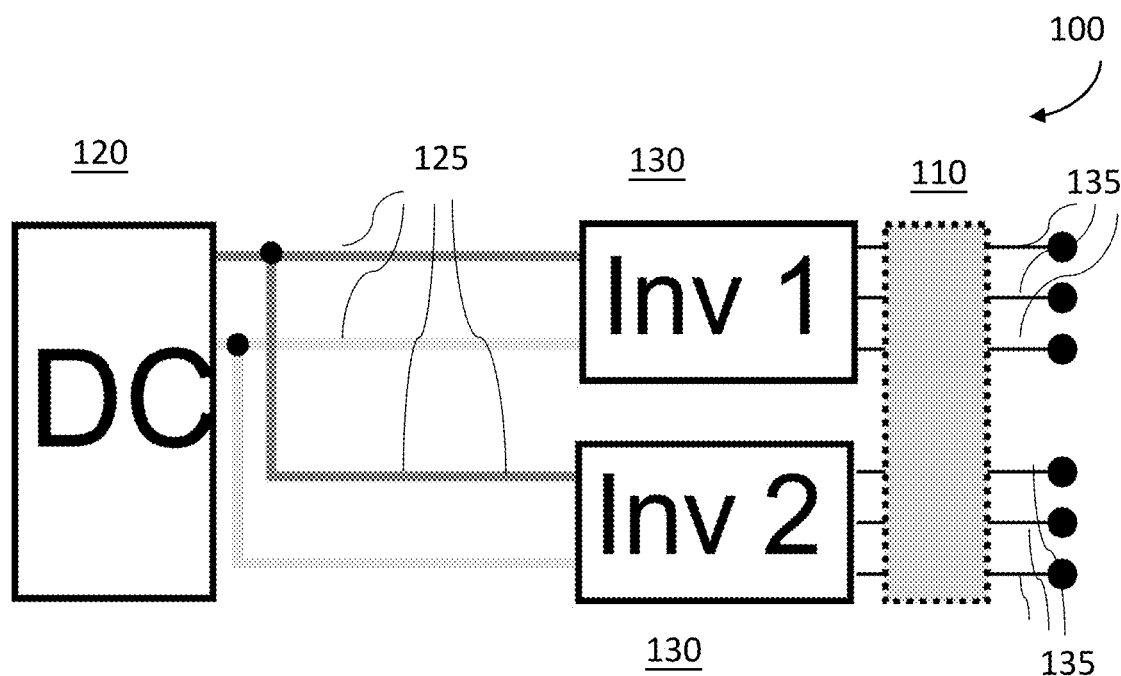
FIG. 1 depicts an illustrative diagram of an electrical power system having an EMI filter in accordance with certain embodiments of the subject matter of the disclosure.

FIG. 1 depicts an illustrative diagram of an electrical power system 100 having an EMI filter 110, in accordance with certain embodiments of the subject matter of the disclosure. The electrical power system 100 includes a DC power source 120, inverter(s) 130, and the EMI filter 110 on a side of the inverters 130. The DC power source 120 can be a battery (e.g., a battery cell, a battery pack, etc.). The DC power source 120 is configured to supply DC current via signal/power buses 125. The one or more inverters 130 are configured to change the DC current to AC current and output the AC current via power/signal buses 135. In the embodiment illustrated, the inverters 130 are configured to generate six-phase AC power. In some embodiments, the EMI filter 110 is configured to suppress electromagnetic noises on the signal/power buses 135.

The EMI filter 110 can use any one of the configurations and embodiments described herein. In some cases, the EMI filter 110 includes one or more inductors and an inductor core (not shown), where an inductor core is referred to as the one or more core structures of the inductors of an EMI filter. In some embodiments, one or more signal buses 135 run through the inductor core of the EMI filter 110. In some cases, the inductor core of the EMI filter 110 includes a plurality of enclosed structures, where each of the plurality of enclosed structures forms a cavity and has two opposing ends providing openings to the cavity. In some embodiments, each of the enclosed structures is configured to encompass one or more signal/power buses.

In some cases, the inductor core of the EMI filter 110 has a modular design with a modular structure. In some cases, a modular structure of the core can be an individual I core, also referred to as an elongated bar, and/or a triangular shaped core structure. In some cases, the modular structure and each bar of the plurality of the elongated bars comprises a magnetic material. In some cases, the magnetic material comprises at least one of ferrite, iron, and high-silicon steel. In some cases, the modular structure of the core can be built by casting, gluing or by bracket frames. In some embodiments, each enclosed structure includes a plurality of elongated bars (i.e., I cores) and one or more connection devices. In some cases, the connection devices can include mechanical connectors and/or chemical connectors. In some cases, the connection devices can include fasteners. In some cases, the connection devices can include adhesive materials. In some embodiments, the modular design can provide a compact mechanical structure with stability for holding signal/power buses in place.

In some embodiments, each enclosed structure of the plurality of enclosed structures has a longitudinal axis. In some cases, each enclosed structure has openings generally perpendicular to the longitudinal axis, such that power/signal buses are running along the longitudinal axis. In some embodiments, each enclosed structure has a cross-sectional shape taken perpendicular to the longitudinal axis. The cross-sectional shape can be, for example, a triangle, a rectangle, a polygon, an irregular shape, or the like. FIG. 3C depicts one example of an enclosed structure 300C. In the example, the enclosed structure 300C has a triangular cross-sectional shape taken perpendicular to the longitudinal axis. In the example of triangular cross-sectional shape, the enclosed structure has a better mechanical stability, while reducing the overall size of the inductor core.

Figure 2:
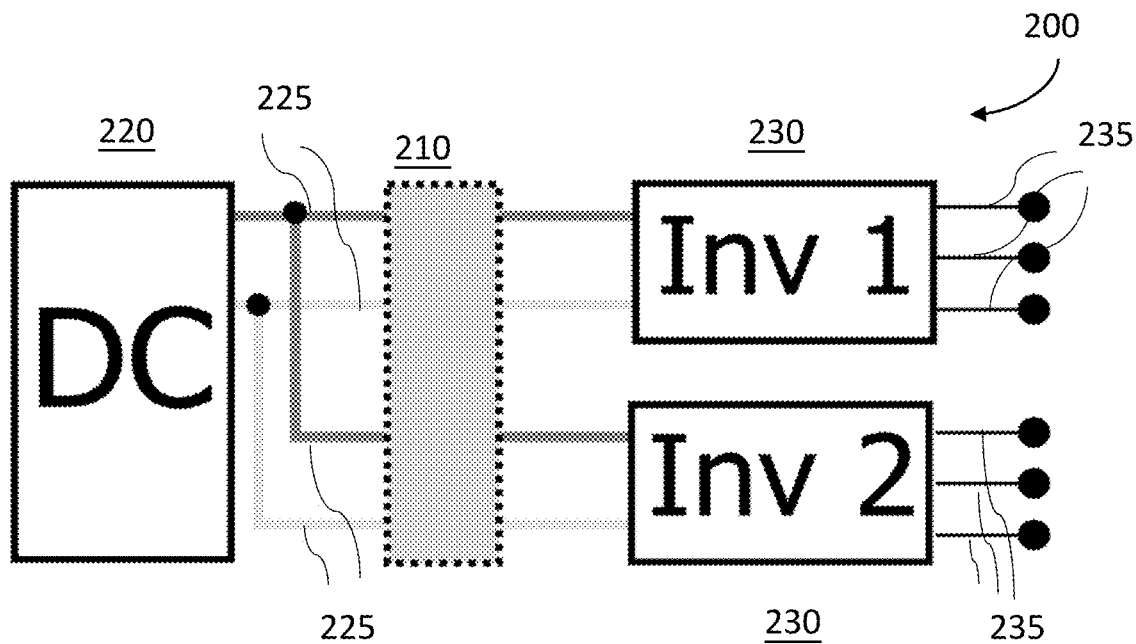
FIG. 2 depicts an illustrative diagram of an electrical power system having an EMI filter, in accordance with certain embodiments of the subject matter of the disclosure.

FIG. 2 depicts an illustrative diagram of an electrical power system 200 having an EMI filter 210, in accordance with certain embodiments of the subject matter of the disclosure. The electrical power system 200 includes a DC power source 220, inverter(s) 230, and the EMI filter 210 on a side of the DC power source 220. The DC power source 220 can be a battery (e.g., a battery cell, a battery pack, etc.). The DC power source 220 is configured to supply DC current via signal/power buses 225. The one or more inverters 230 are configured to change the DC current to AC current and output the AC current via power/signal buses 235. In the embodiment illustrated, the inverters 230 are configured to generate a six-phase AC power. In some embodiments, the EMI filter is configured to suppress electromagnetic noises on the signal buses 225.

The EMI filter 210 can use any one of the configurations and embodiments described herein. In some cases, the EMI filter 210 includes one or more inductors and an inductor core (not shown), where an inductor core is referred to as the one or more core structures of the inductors of an EMI filter. In some embodiments, one or more power buses and/or signal buses 235 run through the inductor core of the EMI filter 210. In some cases, the inductor core of the EMI filter 210 includes one or more enclosed structures, where each of the one or more enclosed structures forms a cavity and has two opposing ends providing openings to the cavity. In some embodiments, each of the enclosed structures is configured to encompass one or more signal/power buses 235.

In some cases, the inductor core of the EMI filter 210 has a modular design. In some embodiments, each enclosed structure includes a plurality of elongated bars and one or more connection devices, where each bar of the plurality of the elongated bars comprises a magnetic material. In some embodiments, each enclosed structure of the one or more enclosed structures has a longitudinal axis. In some cases, each enclosed structure has openings generally perpendicular to the longitudinal axis, such that power/signal buses are running along the longitudinal axis. In some embodiments, each enclosed structure has a cross-sectional shape taken perpendicular to the longitudinal axis.

In certain embodiments, each of the enclosed structure is designed to have a cross-section area based on a predetermined range of a current running through a respective power/signal bus 235. In some embodiments, each of the enclosed structure is designed to have a cross-section area as a function of the predetermined range of the current running through a respective power/signal bus 235. In one example, an enclosed structure designed for a higher current power/signal bus 235 has a larger cross-sectional area than the cross-sectional area of an enclosed structured designed for a lower current power/signal bus 235. As another example, an enclosed structure designed for a higher current power/signal bus 235 has a larger volume than the volume of an enclosed structured designed for a lower current power/signal bus 235. The cross-sectional shape can be, for example, a triangle, a rectangle, a polygon, an irregular shape, or the like. FIG. 3C depicts one example of an enclosed structure 300C. In the example, the enclosed structure 300C has a triangular cross-sectional shape.

Figure 3A:
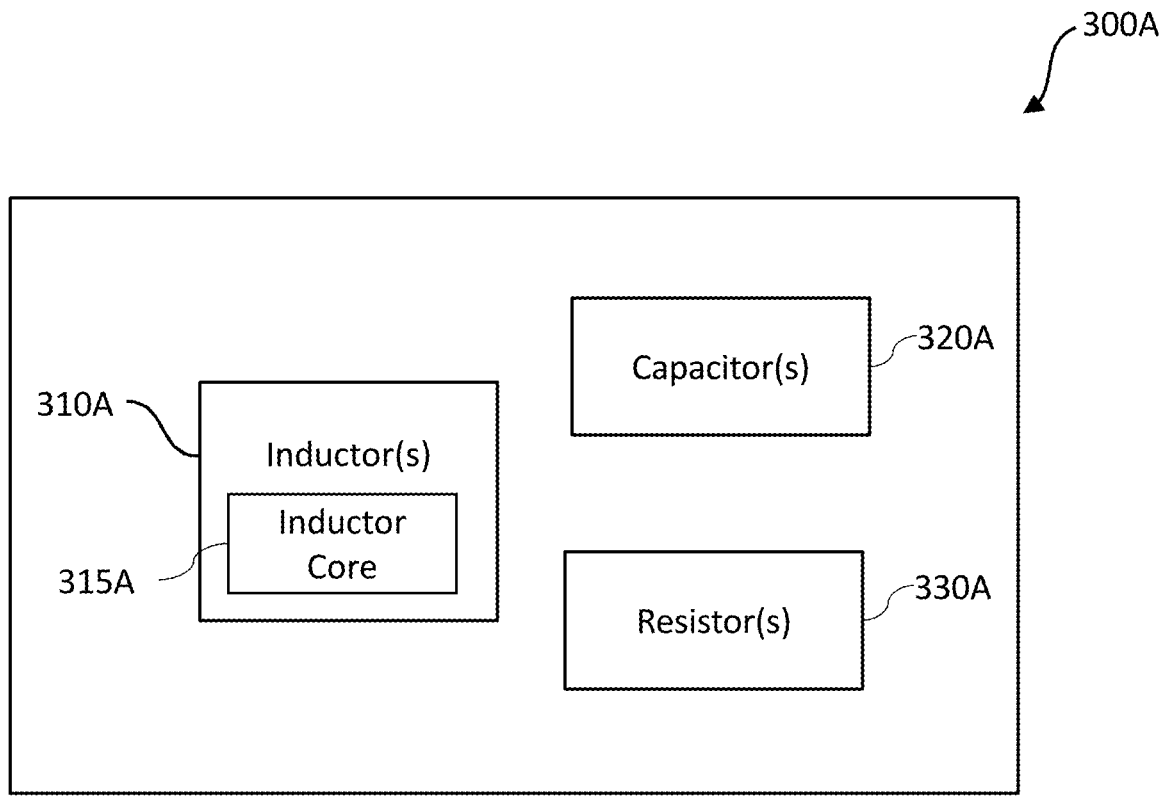
FIG. 3A depicts an illustrative diagram of an EMI filter 300A, in accordance with certain embodiments of the subject matter of the disclosure.

FIG. 3A depicts an illustrative diagram of an EMI filter 300A, in accordance with certain embodiments of the subject matter of the disclosure. The EMI filter 300A includes one or more inductors 310A, one or more capacitors 320A and/or one or more resistors 330A. One or more components shown in EMI filter 300A are optional. In some cases, the one or more inductors 310A include an inductor core 315A. In some embodiments, the EMI filter 300A is a low pass filter to remove high frequency electromagnetic noises.

In some cases, the inductor core 315A includes a plurality of enclosed structures, where each of the plurality of enclosed structure is configured to encompass one or more signal/power buses. In some cases, the inductor core 315A has a modular design.

Figure 3B:
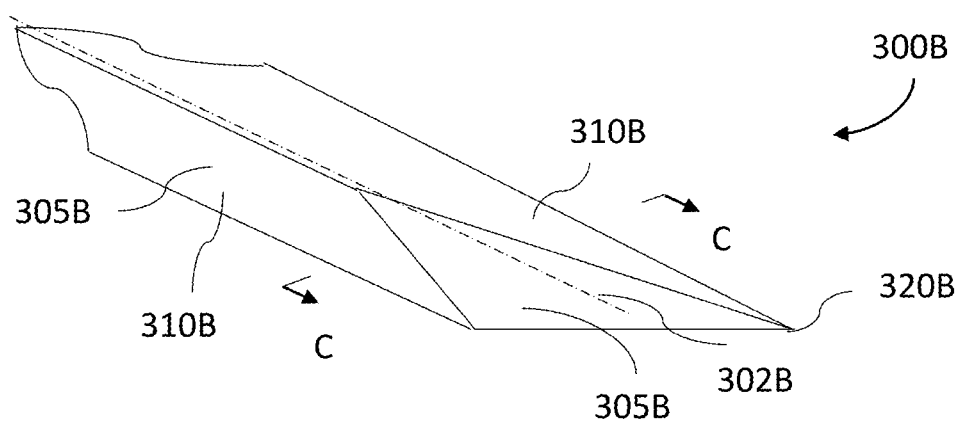
FIG. 3B depicts a perspective view of an illustrative example of an enclosed structure, in accordance with certain embodiments of the subject matter of the disclosure.
Figure 3C:
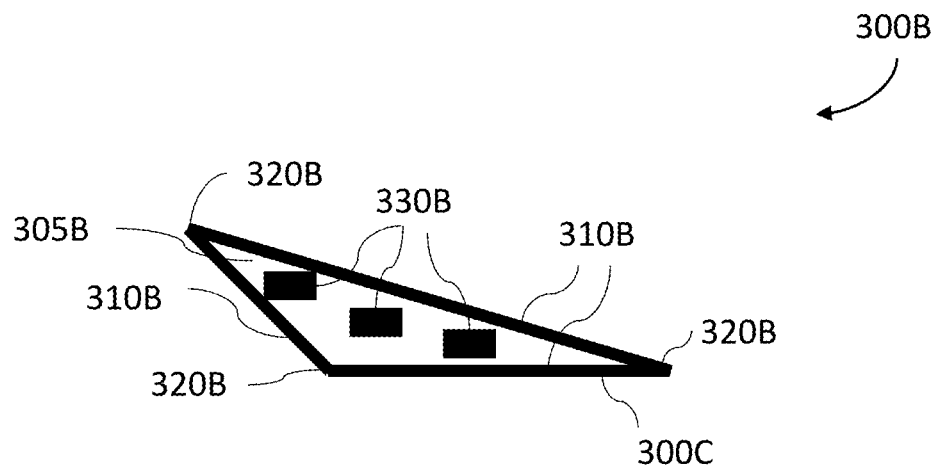
FIG. 3C depicts a cross-sectional view of the illustrative example shown in FIG. 3B.

FIG. 3B depicts a perspective view of an illustrative example of an enclosed structure 300B, in accordance with certain embodiments of the subject matter of the disclosure. In some embodiments, the enclosed structure 300B is a modular unit for the modular design, formed by molding, gluing, bracket frame, and/or the like. In some embodiments, the enclosed structure 300B includes a plurality of elongated bars 310B and one or more connection devices 320B, where each bar of the plurality of the elongated bars comprises a magnetic material. In some cases, the enclosed structure has openings 305B generally perpendicular to the longitudinal axis 302B, such that power/signal buses are running along the longitudinal axis. In some embodiments, the enclosed structure has a cross-sectional shape taken perpendicular to the longitudinal axis 302B. The enclosed structure 300B can have any one of the various cross-sectional shapes, for example, a triangle, a rectangle, a polygon, an irregular shape, or the like. In some cases, the enclosed structure is a hollow cylinder. In some cases, the enclosed structure is a hollow cylinder having a cross-sectional area remaining approximately the same along the longitudinal axis 302B.

Figure 3D:
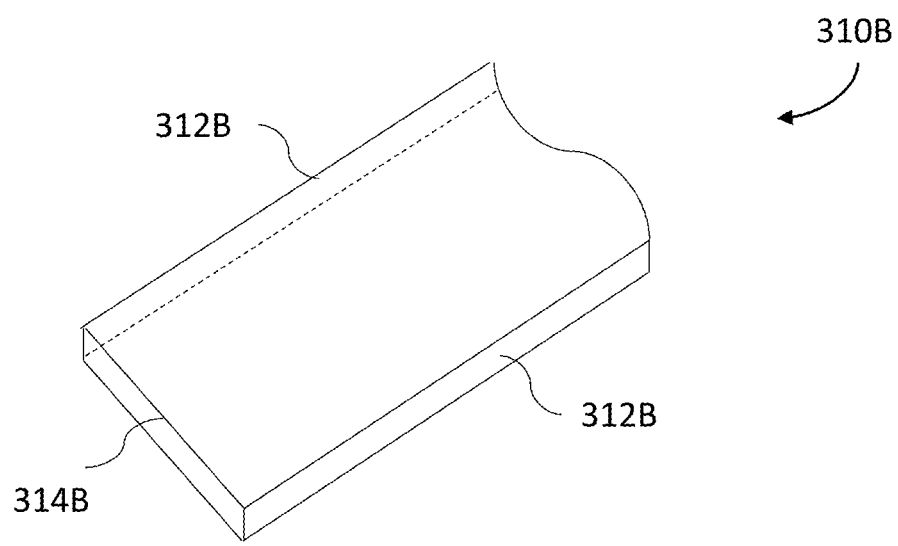
FIG. 3D depicts a perspective view of an illustrative example of an elongated bar, in accordance with certain embodiments of the subject matter of the disclosure.

FIG. 3C depicts a cross-sectional view of the illustrative example 300B shown in FIG. 3B, in accordance with certain embodiments of the subject matter of the disclosure. FIG. 3D depicts a perspective view of an illustrative example of an elongated bar 310B, in accordance with certain embodiments of the subject matter of the disclosure. The enclosed structure 300B has a cross-sectional shape 300C taken perpendicular to the longitudinal axis of the enclosed structure 300B. In some embodiments, the elongated bar 310B can be a rectangular bar. In some embodiments, the elongated bar 310B can be an I-shape bar having straight edges 312B. In some embodiments, the elongated bar 310B can have straight end(s) 314B. In some embodiments, the elongated bar 310B can have irregular ends.

In some embodiments, the adjacent elongated bars 310B of the enclosed structure 300B are connected by one or more connection devices 320B. In some cases, the connection devices 320B can include mechanical connectors and/or chemical connectors. In some cases, the connection devices 320B can include a fastener. In some cases, the connection devices 320B can include an adhesive. In some cases, the enclosed structure 300B is configured to encompass one or more power or signal buses 330B. In some cases, the power/signal buses 330B are direct-current (DC) buses. In some cases, the power/signal buses 330B are a plurality of DC power/signal buses, also referred to as DC buses, having different directions. In some cases, the power/signal buses 330B are alternating-current (AC) power/signal buses, also referred to as AC buses. In some cases, the power/signal buses 330B are plurality of AC buses having different phases.

In some embodiments, the enclosed structure 300B is designed to have a cross-section area based on a predetermined range of the currents running through the power/signal buses 330B. In certain embodiments, the enclosed structure 300B is designed to have a cross-section area as a function of the predetermined range of the currents running through the power/signal buses 330B. In one example, the enclosed structure 300B designed for higher current power/signal buses has a larger cross-sectional area than the cross-sectional area of an enclosed structured designed for lower current power/signal buses 330B. As another example, the enclosed structure 300B designed for higher current power/signal bus 330B has a larger volume than the volume of an enclosed structured designed for lower current power/signal buses.

Figure 3E:
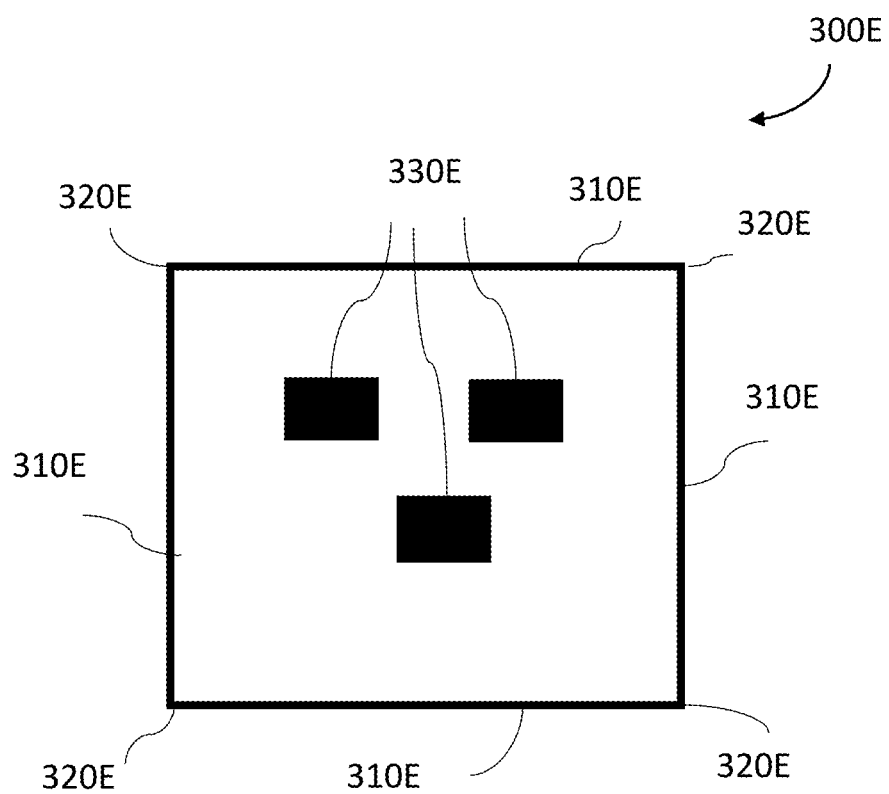
FIG. 3E depicts a cross-sectional view of an illustrative example of an enclosed structure, in accordance with certain embodiments of the subject matter of the disclosure.

FIG. 3E depicts a cross-sectional view of an illustrative example of an enclosed structure 300E, in accordance with certain embodiments of the subject matter of the disclosure. The enclosed structure 300E includes a plurality of elongated bars 310E. The elongated bars 310E can use any embodiments of elongated bars described herein. In some embodiments, the elongated bar 310E can be a rectangular bar. In some embodiments, the elongated bar 310E can be an I-shape bar with straight sides. In some cases, the adjacent elongated bars 310E of the enclosed structure 300E are connected by one or more connection devices 320E. In some cases, the connection devices 320E can include mechanical connectors and/or chemical connectors. In some cases, the connection devices 320E can include a fastener. In some cases, the connection devices 320E can include an adhesive. In some cases, the enclosed structure 300E is configured to encompass one or more power or signal buses 330E. In some cases, the power/signal buses 330E are direct-current (DC) buses. In some cases, the power/signal buses 330E are a plurality of DC buses having different directions. In some cases, the power/signal buses 330E are alternating-current (AC) buses. In some cases, the power/signal buses 330E are a plurality of AC buses having different phases.

Figure 4:
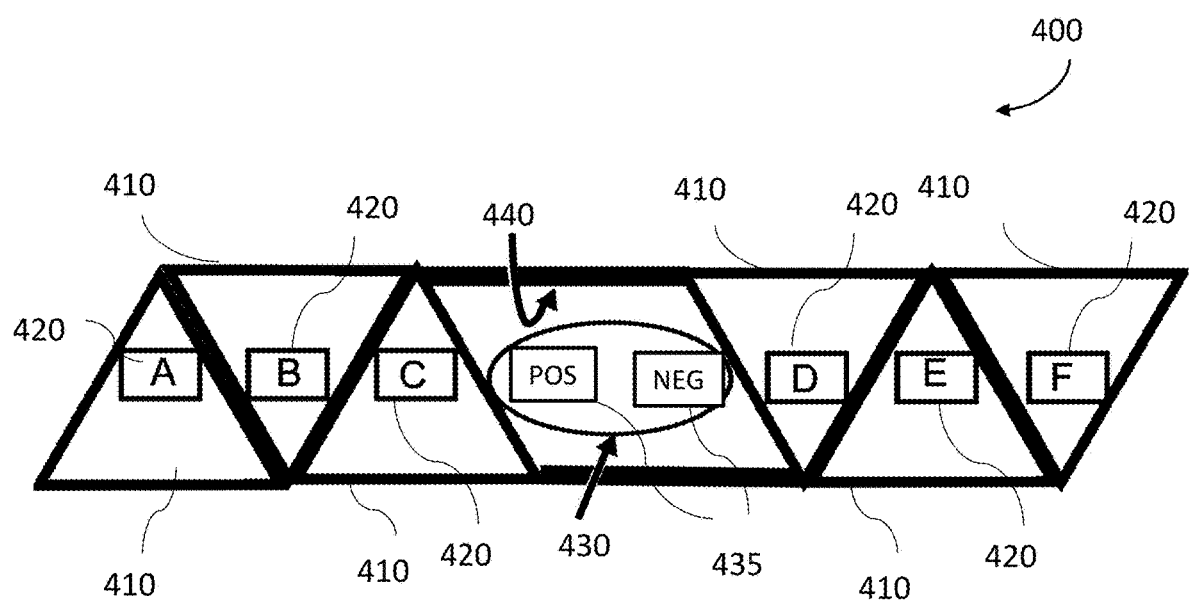
FIG. 4 depicts a cross-sectional view of an illustrative example of an inductor core, in accordance with certain embodiments of the subject matter of the disclosure.

FIG. 4 depicts a cross-sectional view of an illustrative example of an inductor core 400, in accordance with certain embodiments of the subject matter of the disclosure. In one example, the inductor core 400 includes a plurality of enclosed structures 410. In this example, the inductor core 400 is configured to encompass six power/signal buses 420, where the power/signal buses 420 are AC buses of different phases. In some embodiments, each enclosed structure 410 has a longitudinal axis and has a cross-sectional shape taken perpendicular to the longitudinal axis. In some cases, one or more enclosed structures 410 each has a triangular cross-sectional shape taken perpendicular to the longitudinal axis. In some cases, two of the plurality of enclosed structures 410 are arranged to form a parallelogram.

In some embodiments, the plurality of enclosed structures 410 are separated into two groups, with a flux tunnel 430 between the two groups of the enclosed structures 410. The flux tunnel 430 is configured to prevent the magnetic flux caused by DC buses 435 from coupling to the rest of the circuit. In one example, the DC buses 435 include buses with different DC directions. In some cases, the flux tunnel 430 is formed with two non-magnetic conductor bars 440. In one example, the flux tunnel 430 and/or the bars 440 are configured to provide structural integrity. In some cases, the flux tunnel 430 is formed with two magnetic conductor bars 440.

Figures 5A, 5B:
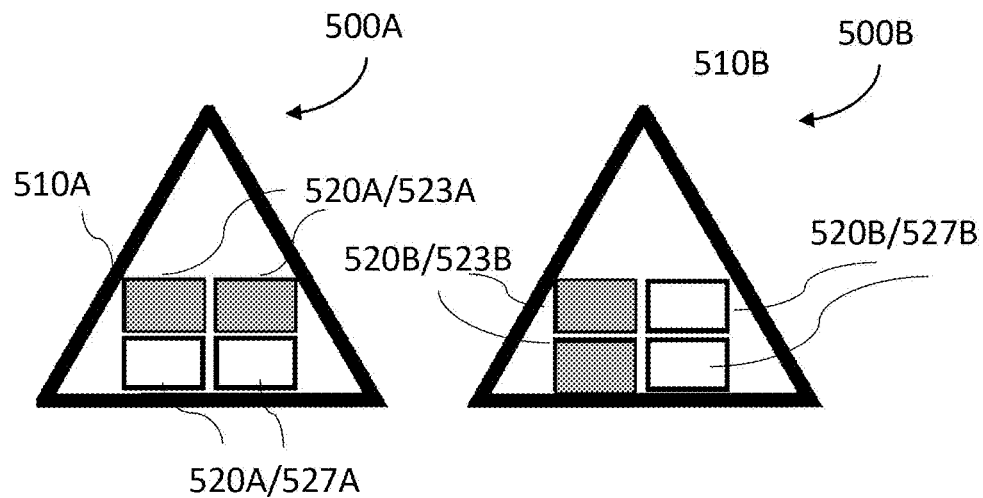
FIG. 5A depicts a cross-sectional view of an illustrative example of inductor core, in accordance with certain embodiments of the subject matter of the disclosure.
FIG. 5B depicts a cross-sectional view of an illustrative example of inductor core, in accordance with certain embodiments of the subject matter of the disclosure.

FIG. 5A depicts a cross-sectional view of an illustrative example of inductor core 500A, in accordance with certain embodiments of the subject matter of the disclosure. In one example, the inductor core 500A includes an enclosed structure 510A. In this example, the inductor core 500A is configured to encompass four power/signal buses 520A, where the power/signal buses 520A are DC buses of various directions. In some designs, the power/signal buses 520A includes buses 523A of a first direction and buses 527A of a second direction, where the first direction is different from the second direction. In some cases, the enclosed structure 510A is configured to encompass DC power/signal buses 520A of different directions. In some embodiments, the enclosed structure 510A has a longitudinal axis and has a cross-sectional shape taken perpendicular to the longitudinal axis. In some cases, the enclosed structure 510A has a triangular cross-sectional shape taken perpendicular to the longitudinal axis. In this example, DC power/signal buses 520A of a same direction (e.g., 523A or 527A) are placed side-by-side within the enclosed structure 510A.

FIG. 5B depicts a cross-sectional view of an illustrative example of inductor core 500B, in accordance with certain embodiments of the subject matter of the disclosure. In one example, the inductor core 500B includes an enclosed structure 510B. In this example, the inductor core 500B is configured to encompass four power/signal buses 520B, where the power/signal buses 520B are DC buses of various directions. In some designs, the power/signal buses 520B includes buses 523B of a first direction and buses 527B of a second direction, where the first direction is different from the second direction. In some cases, the enclosed structure 510B is configured to encompass DC power/signal buses 520B of different directions. In some embodiments, the enclosed structure 510B has a longitudinal axis and has a cross-sectional shape taken perpendicular to the longitudinal axis. In some cases, the enclosed structure 510B has a triangular cross-sectional shape taken perpendicular to the longitudinal axis. In this example, DC power/signal buses 520B of a same direction (e.g., 523B or 527B) are stacked within the enclosed structure 510B.

Figures 5C, 5D:
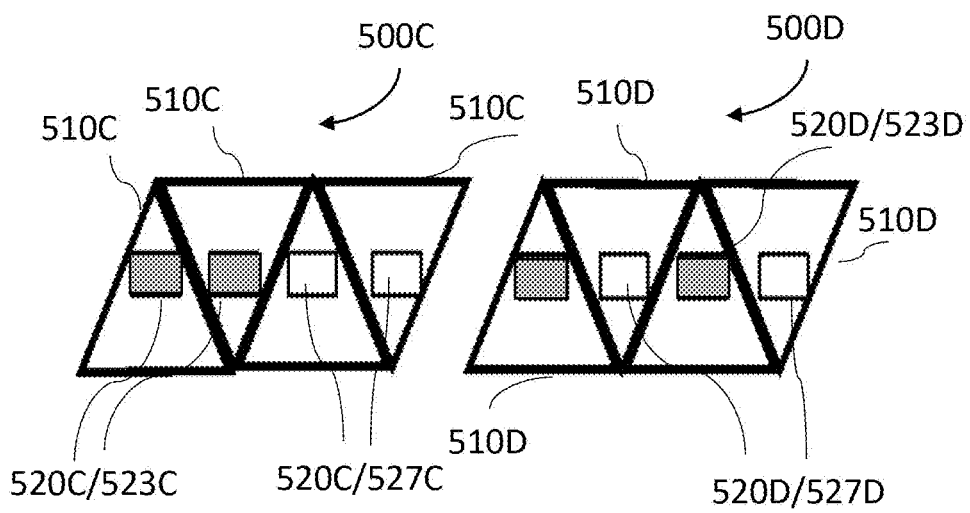
FIG. 5C depicts a cross-sectional view of an illustrative example of inductor core, in accordance with certain embodiments of the subject matter of the disclosure.
FIG. 5D depicts a cross-sectional view of an illustrative example of inductor core, in accordance with certain embodiments of the subject matter of the disclosure.

FIG. 5C depicts a cross-sectional view of an illustrative example of inductor core 500C, in accordance with certain embodiments of the subject matter of the disclosure. In one example, the inductor core 500C includes a plurality of enclosed structures 510C. In this example, the inductor core 500C is configured to encompass four power/signal buses 520C, where the power/signal buses 520C are DC buses of various directions. In some designs, the power/signal buses 520C includes buses 523C of a first direction and buses 527C of a second direction, where the first direction is different from the second direction. In some cases, each enclosed structure 510C is configured to encompass a respective DC power/signal buses 520C with one direction. In some embodiments, each enclosed structure 510C has a longitudinal axis and has a cross-sectional shape taken perpendicular to the longitudinal axis. In some cases, each enclosed structure 510C has a triangular cross-sectional shape taken perpendicular to the longitudinal axis. In some cases, two adjacent enclosed structures 510C are arranged to form a parallelogram. In this example, the enclosed structures 510C encompassing DC buses 523C in a first direction are adjacent to each other. In this example, additionally, the enclosed structures 510C encompassing DC power/signal buses 527C in a second direction are adjacent to each other.

FIG. 5D depicts a cross-sectional view of an illustrative example of inductor core 500D, in accordance with certain embodiments of the subject matter of the disclosure. In one example, the inductor core 500D includes a plurality of enclosed structures 510D. In this example, the inductor core 500D is configured to encompass four power/signal buses 520D, where the power/signal buses 520D are DC power/signal buses of various directions. In some designs, the power/signal buses 520D includes buses 523D of a first direction and buses 527D of a second direction, where the first direction is different from the second direction. In some cases, each enclosed structure 510D is configured to encompass a respective DC power/signal buses 520D with one direction. In some embodiments, each enclosed structure 510D has a longitudinal axis and has a cross-sectional shape taken perpendicular to the longitudinal axis. In some cases, each enclosed structure 510D has a triangular cross-sectional shape taken perpendicular to the longitudinal axis. In some cases, two adjacent enclosed structures 510D are arranged to form a parallelogram. In this example, an enclosed structure 510D encompassing a DC power/signal bus 523D in a first direction and an enclosed structure 510D encompassing a DC power/signal bus 527D in a second direction are adjacent to each other.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

What is claimed is:

1. An inductor core of an electromagnetic interference (EMI) filter, comprising:
a plurality of enclosed structures, each enclosed structure of the plurality of enclosed structures having a longitudinal axis and comprising a plurality of elongated bars and at least one connection device;
wherein the plurality of elongated bars define a cavity extending generally along the longitudinal axis;
wherein each elongated bar of the plurality of the elongated bars comprises a magnetic material; and
wherein each enclosed structure of the plurality of enclosed structures is configured to encompass within the cavity a signal bus.

2. The inductor core of claim 1, wherein at least one of the plurality of enclosed structures has a triangular cross-sectional shape taken perpendicular to the longitudinal axis.

3. The inductor core of claim 2, wherein two of the plurality of enclosed structures each has a triangular cross-sectional shape, and wherein the two of the plurality of enclosed structures are arranged to form a parallelogram.

4. The inductor core of claim 1, wherein two of the plurality of enclosed structures each is configured to encompass a respective bus, and wherein the respective buses have different phases from each other.

5. The inductor core of claim 1, wherein the at least one connection device comprises at least one of an adhesive or a fastener.

6. The inductor core of claim 1, wherein at least one of the plurality of enclosed structures are configured to encompass a plurality of DC buses having different directions.

7. The inductor core of claim 1, wherein the plurality of enclosed structures are configured to encompass a plurality of AC buses having different phases.

8. An EMI filter, comprising:
a capacitor; and
an inductor having an inductor core, the inductor core comprising a plurality of enclosed structures, each enclosed structure having a longitudinal axis and comprising a plurality of elongated bars and at least one connection device;
wherein the plurality of elongated bars define a cavity extending generally along the longitudinal axis;
wherein each elongated bar of the plurality of the elongated bars comprises a magnetic material; and
wherein each enclosed structure of the plurality of enclosed structures is configured to encompass within the cavity a bus of a power supply.

9. The EMI filter of claim 8, wherein at least one of the plurality of enclosed structures has a triangular cross-sectional shape taken perpendicular to the longitudinal axis.

10. The EMI filter of claim 9, wherein two of the plurality of enclosed structures each has a triangular cross-sectional shape, and wherein the two of the plurality of enclosed structures are arranged to form a parallelogram.

11. The EMI filter of claim 8, wherein two of the plurality of enclosed structures each is configured to encompass a respective bus, and wherein the respective buses have different phases from each other.

12. The EMI filter of claim 8, wherein the at least one connection device comprises at least one of an adhesive or a fastener.

13. The EMI filter of claim 8, wherein at least one of the plurality of enclosed structures are configured to encompass a plurality of DC buses having different directions.

14. The EMI filter of claim 8, wherein the plurality of enclosed structures are configured to encompass a plurality of AC buses having different phases.

15. The EMI filter of claim 8, wherein the magnetic material comprises at least one of ferrite, iron, and steel.

16. An inductor core of an electromagnetic interference (EMI) filter, comprising:
a plurality of enclosed structures, each enclosed structure of the plurality of enclosed structures having a longitudinal axis and a triangular cross-sectional shape taken perpendicular to the longitudinal axis;
wherein each enclosed structure of the plurality of enclosed structures comprises a magnetic material; and
wherein each enclosed structure of the plurality of enclosed structures is configured to encompass a signal bus.

17. The inductor core of claim 16, wherein two enclosed structures of the plurality of enclosed structures are arranged to form a parallelogram.

18. The inductor core of claim 16, wherein two of the plurality of enclosed structures each is configured to encompass a respective bus, and wherein the respective buses have different phases from each other.

19. The inductor core of claim 16, wherein each enclosed structure of the plurality of enclosed structures comprising a plurality of elongated bars and at least one connection device.

20. The inductor core of claim 19, wherein the at least one connection device comprises at least one of an adhesive or a fastener.

21. An EMI filter, comprising:
a plurality of enclosed structures, each enclosed structure of the plurality of enclosed structures comprising a plurality of elongated bars and at least one connection device, wherein the at least one connection device comprises at least one of an adhesive or a fastener;
wherein each elongated bar of the plurality of the elongated bars comprises a magnetic material; and
wherein each enclosed structure of the plurality of enclosed structures is configured to encompass a signal bus.

* * * * *